(12) United States Patent
Hsueh et al.

(10) Patent No.: US 10,778,145 B2
(45) Date of Patent: Sep. 15, 2020

(54) MAGNETICALLY PUMPED VOLTAGE CONTROLLED OSCILLATOR

(71) Applicant: MEDIATEK INC., Hsin-Chu (TW)

(72) Inventors: Yu-Li Hsueh, Hsin-Chu (TW); Po-Chun Huang, Hsin-Chu (TW); Ang-Sheng Lin, Hsinchu (TW); Wei-Hao Chiu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/681,771

(22) Filed: Nov. 12, 2019

(65) Prior Publication Data

US 2020/0212843 A1 Jul. 2, 2020

Related U.S. Application Data

(60) Provisional application No. 62/787,447, filed on Jan. 2, 2019.

(51) Int. Cl.
*H03B 5/12* (2006.01)

(52) U.S. Cl.
CPC .......... *H03B 5/1228* (2013.01); *H03B 5/1212* (2013.01); *H03B 5/1218* (2013.01); *H03B 5/1296* (2013.01)

(58) Field of Classification Search
CPC ...... H03B 5/12; H03B 5/1206; H03B 5/1209; H03B 5/1212; H03B 5/1215;
(Continued)

(56) References Cited

U.S. PATENT DOCUMENTS 6,710,667 B2 * 3/2004 Nagano ................. H03B 5/20
330/253
10,498,289 B2 * 12/2019 Shu ..................... H03B 5/1228
(Continued)

FOREIGN PATENT DOCUMENTS

WO 2013/063610 A1 5/2013
WO 2017/075597 A1 5/2017

OTHER PUBLICATIONS

Lightbody, A—195 dBc/Hz FoMT 20.8-to-28-GHz LC VCO with Transformer-Enhanced 30% Tuning Range in 65-nm CMOS, 2018 IEEE Radio Frequency Integrated Circuits Symposium, pp. 200-203, 2018.
(Continued)

*Primary Examiner* — Levi Gannon
(74) *Attorney, Agent, or Firm* — Winston Hsu

(57) ABSTRACT

A voltage controlled oscillator includes a first inductor, a second inductor, a first metal oxide semiconductor (MOS) transistor, a second MOS transistor, and an inductor-capacitor (LC) tank circuit. A first end of the first inductor and a first end of the second inductor are coupled to a first power rail. A drain node of the first MOS transistor is coupled to a second end of the first inductor. A drain node of the second MOS transistor is coupled to a second end of the second inductor. Source nodes of the first MOS transistor and the second MOS transistor are coupled to a second power rail. The LC tank circuit is coupled to gate nodes of the first MOS transistor and the second MOS transistor, wherein energy is magnetically pumped into the LC tank circuit through the first inductor and the second inductor.

8 Claims, 5 Drawing Sheets

(58) Field of Classification Search
CPC .. H03B 5/1218; H03B 5/1228; H03B 5/1231; H03B 5/1256; H03B 5/1296; H03B 2201/0216
USPC .......................................... 331/117 FE, 117 R
See application file for complete search history.

(56) References Cited

U.S. PATENT DOCUMENTS

| | | | | |
|---|---|---|---|---|
| 2006/0033587 | A1* | 2/2006 | Cabanillas | H03B 5/1218 331/108 C |
| 2008/0174378 | A1* | 7/2008 | Cusmai | H03B 27/00 331/167 |
| 2010/0194485 | A1 | 8/2010 | Chawla | |
| 2014/0077890 | A1* | 3/2014 | Babaie | H03B 1/00 331/117 R |
| 2014/0320215 | A1* | 10/2014 | Staszewski | H03H 11/0405 331/18 |
| 2016/0056762 | A1* | 2/2016 | Ximenes | H03B 5/1265 331/117 FE |
| 2016/0099681 | A1* | 4/2016 | Zong | H03B 5/1215 331/117 FE |
| 2017/0111009 | A1 | 4/2017 | Chiu | |
| 2017/0126177 | A1* | 5/2017 | Kalia | H03B 5/1212 |
| 2017/0179216 | A1* | 6/2017 | Li | H01L 28/10 |
| 2017/0366137 | A1* | 12/2017 | Shahmohammadi | H03B 5/1228 |
| 2018/0109225 | A1* | 4/2018 | Jin | H03B 5/1296 |
| 2019/0081595 | A1* | 3/2019 | Luo | H03B 5/1212 |

OTHER PUBLICATIONS

Wang, A Low Phase-Noise Class-C VCO Using Novel 8-Shaped Transformer, 2015 IEEE International Symposium on Circuits and Systems, pp. 886-889, 2015.

Padovan, A Quad-Core 15GHz BiCMOS VCO with -124dBc/Hz Phase Noise at 1 MHz Offset, -189dBc/Hz FOM, and Robust to Multimode Concurrent Oscillations, ISSCC 2018/ Session 23 /LO Generation / 23.6, pp. 376-377 and a page including Figure 23.6.7, 2018.

Yin, A 0.2V Energy-Harvesting BLE Transmitter with a Micropower Manager Achieving 25% System Efficiency at 0dBm Output and 5.2nW Sleep Power in 28nm CMOS, ISSCC 2018 /Session 28 /Wireless Connectivity /28.5, pp. 450-451 and a page including Figure 28.5.7, 2018.

Babaie, A Class-F CMOS Oscillator, IEEE Journal of Solid-State Circuits, vol. 48, No. 12, Dec. 2013, pp. 3120-3133, 2013.

* cited by examiner

MAGNETICALLY PUMPED VOLTAGE CONTROLLED OSCILLATOR

CROSS REFERENCE TO RELATED APPLICATIONS

This application claims the benefit of U.S. provisional application No. 62/787,447, filed on Jan. 2, 2019 and incorporated herein by reference.

BACKGROUND

The present invention relates to an oscillator circuit, and more particularly, to a magnetically pumped voltage controlled oscillator.

In general, a voltage controlled oscillator (VCO) is an oscillator circuit that outputs an oscillating signal having a frequency that varies in response to an input control voltage. VCOs are fundamental components that are employed in a broad range of applications. By way of example, VCOs are utilized for phase locked loop (PLL) circuits. A conventional VCO may employ an inductor-capacitor (LC) tank to act as a resonator. The conventional VCO, however, has certain disadvantages resulting from direct connection between the LC tank and drain nodes of metal oxide semiconductor (MOS) transistors.

SUMMARY

One of the objectives of the claimed invention is to provide a magnetically pumped voltage controlled oscillator.

According to a first aspect of the present invention, an exemplary voltage controlled oscillator is disclosed. The exemplary voltage controlled oscillator includes a first inductor, a second inductor, a first metal oxide semiconductor (MOS) transistor, a second MOS transistor, and an inductor-capacitor (LC) tank circuit. A first end of the first inductor and a first end of the second inductor are both coupled to a first power rail. A drain node of the first MOS transistor is coupled to the second end of the first inductor, and a source node of the first MOS transistor is coupled to a second power rail. A drain node of the second MOS transistor is coupled to the second end of the second inductor, and a source node of the second MOS transistor is coupled to the second power rail. The LC tank circuit is coupled to the gate node of the first MOS transistor and the gate node of the second MOS transistor, wherein energy is magnetically pumped into the LC tank circuit through the first inductor and the second inductor, such that there is no direct connection between the LC tank circuit and the drain node of the first MOS transistor and there is no direct connection between the LC tank circuit and the drain node of the second MOS transistor.

According to a second aspect of the present invention, an exemplary voltage controlled oscillator is disclosed. The exemplary voltage controlled oscillator includes a first inductor, a second inductor, a first P-channel metal oxide semiconductor (PMOS) transistor, a second PMOS transistor, a first N-channel metal oxide semiconductor (NMOS) transistor, a second NMOS transistor, and an inductor-capacitor (LC) tank circuit. A first end of the second inductor is coupled to a first end of the first inductor. A drain node of the first PMOS transistor is coupled to a second end of the first inductor, and a source node of the first MOS transistor is coupled to a first power rail. A drain node of the second PMOS transistor is coupled to a second end of the second inductor, and a source node of the second PMOS transistor is coupled to the first power rail. A drain node of the first NMOS transistor is coupled to the second end of the first inductor, and a source node of the first MOS transistor is coupled to a second power rail. A drain node of the second NMOS transistor is coupled to the second end of the second inductor, and a source node of the second NMOS transistor is coupled to the second power rail. The LC tank circuit is coupled to the gate node of the first PMOS transistor, the gate node of the second PMOS transistor, the gate node of the first NMOS transistor, and the gate node of the second NMOS transistor, wherein energy is magnetically pumped into the LC tank circuit through the first inductor and the second inductor, such that there is no direct connection between the LC tank circuit and the drain node of each of the first PMOS transistor and the first NMOS transistor and there is no direct connection between the LC tank circuit and the drain node of each of the second PMOS transistor and the second NMOS transistor.

According to a third aspect of the present invention, an exemplary voltage controlled oscillator is disclosed. The exemplary voltage controlled oscillator includes a first inductor, a second inductor, a third inductor, a fourth inductor, a first P-channel metal oxide semiconductor (PMOS) transistor, a second PMOS transistor, a first N-channel metal oxide semiconductor (NMOS) transistor, a second NMOS transistor, and an inductor-capacitor (LC) tank circuit. A first end of the second inductor is coupled to a first end of the first inductor. A first end of the fourth inductor is coupled to a first end of the third inductor. A drain node of the first PMOS transistor is coupled to a second end of the first inductor, and a source node of the first MOS transistor is coupled to a first power rail. A drain node of the second PMOS transistor is coupled to a second end of the second inductor, and a source node of the second PMOS transistor is coupled to the first power rail. A drain node of the first NMOS transistor is coupled to a second end of the third inductor, and a source node of the first MOS transistor is coupled to a second power rail. A drain node of the second NMOS transistor is coupled to a second end of the fourth inductor, and a source node of the second NMOS transistor is coupled to the second power rail. The LC tank circuit is coupled to the gate node of the first PMOS transistor, the gate node of the second PMOS transistor, the gate node of the first NMOS transistor, and the gate node of the second NMOS transistor, wherein energy is magnetically pumped into the LC tank circuit through the first inductor, the second inductor, the third inductor, and the fourth inductor, such that there is no direct connection between the LC tank circuit and the drain node of each of the first PMOS transistor and the first NMOS transistor and there is no direct connection between the LC tank circuit and the drain node of each of the second PMOS transistor and the second NMOS transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
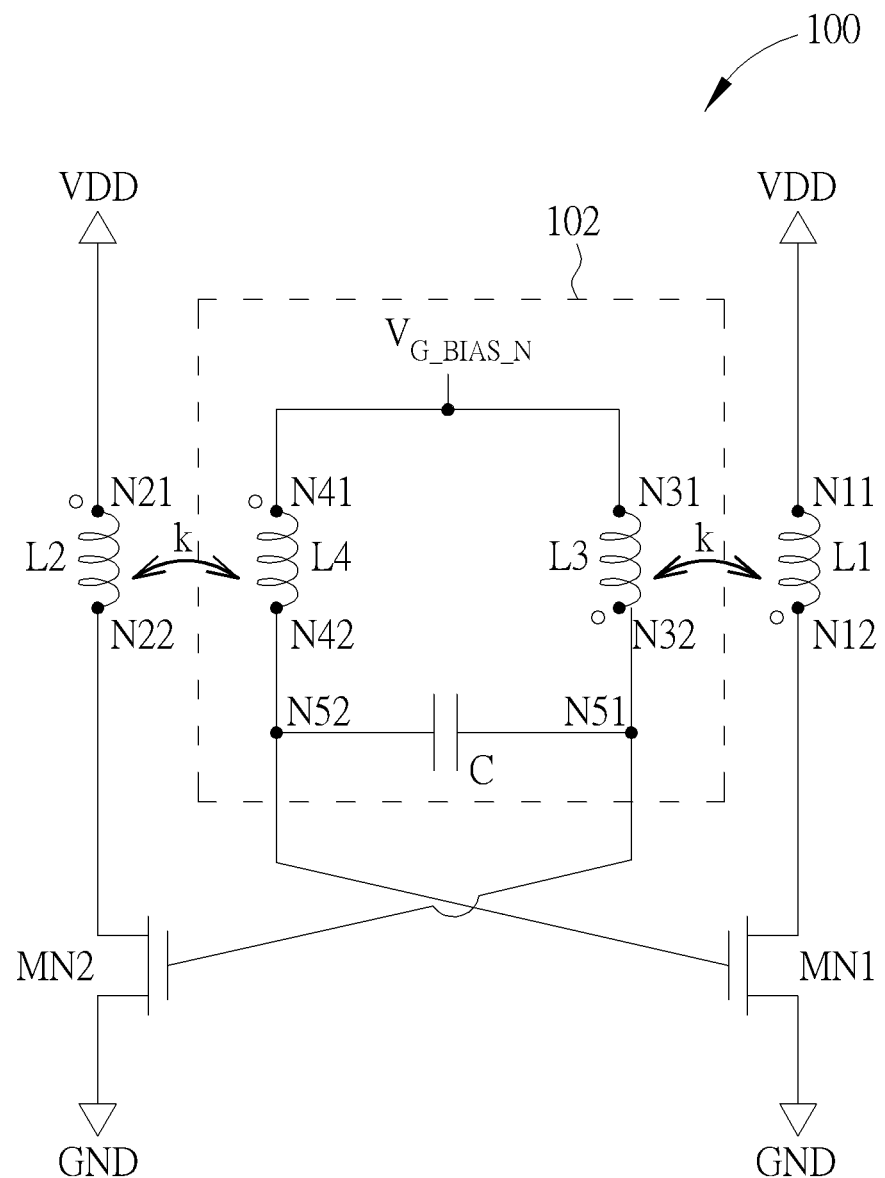
FIG. 1 is a circuit diagram illustrating a first magnetically pumped voltage controlled oscillator according to an embodiment of the present invention.

FIG. 1 is a circuit diagram illustrating a first magnetically pumped voltage controlled oscillator (VCO) according to an embodiment of the present invention. The VCO 100 includes a single inductor-capacitor (LC) tank circuit 102, a plurality of inductors L1 and L2, and a plurality of N-channel metal oxide semiconductor (NMOS) transistors MN1 and MN2. The LC tank circuit 102 includes a plurality of inductors L3 and L4 and a capacitor C. By way of example, but not limitation, the capacitor C may be implemented by a voltage-controlled capacitor that is used to adjust a resonant frequency of the LC tank circuit 102 in response to a control voltage of the VCO. One end N11 of the inductor L1 is coupled to a power rail VDD, and the other end N12 of the inductor L1 is coupled to a drain node of the NMOS transistor MN1. One end N21 of the inductor L2 is coupled to the power rail VDD, and the other end N22 of the inductor L2 is coupled to a drain node of the NMOS transistor MN2. A source node of the NMOS transistor MN1 and a source node of the NMOS transistor MN2 are both coupled to a power rail GND. In this embodiment, the power rail VDD is used to deliver a supply voltage (e.g., 0.6V or 0.8V), and the power rail GND is used to deliver a ground voltage (e.g., 0V).

The LC tank circuit 102 is coupled to a gate node of the NMOS transistor MN1 and a gate node of the NMOS transistor MN2. In this embodiment, energy is magnetically pumped into the LC tank circuit 102 through the inductors L1 and L2, such that there is no direct connection between the LC tank circuit 102 and the drain node of the MOS transistor MN1 and there is no direct connection between the LC tank circuit 102 and the drain node of the MOS transistor MN2. As shown in FIG. 1, the LC tank circuit 102 and the NMOS transistors MN1 and MN2 are cross-coupled. Specifically, one end of the capacitor N51 is coupled to the gate node of the NMOS transistor, and the other end N52 of the capacitor C is coupled to the gate node of the NMOS transistor MN1, where differential oscillating signals are generated at two ends of the capacitor C. In this embodiment, the LC tank circuit 102 is directly connected to gate nodes of the NMOS transistor MN1 and MN2 without via any magnetic coupling (i.e., inductive coupling). Hence, the pumping force is not weakened significantly due to the fact the LC tank circuit 102 is not totally separated from drain nodes and gate nodes of NMOS transistors MN1 and MN2. In addition, the inductor L3 is magnetically coupled to the inductor L1, where one end N31 of the inductor L3 is coupled to a bias voltage $V_{G\_BIAS\_N}$ that may be generated from a bias voltage generator (not shown), and the other end N32 of the inductor L3 is coupled to one end N51 of the capacitor C; and the inductor L4 is magnetically coupled to the inductor L2, where one end N41 of the inductor L4 is coupled to the bias voltage $V_{G\_BIAS\_N}$, and the other end N42 of the inductor L4 is coupled to the other end N52 of the capacitor C.

For example, the inductors L1 and L2 may have the same inductance value $L_D$, the inductors L3 and L4 may have the same inductance value $L_G$, and magnetic coupling (i.e., inductive coupling) between inductors L1 and L3 and magnetic coupling (i.e., inductive coupling) between inductors L2 and L4 may have the same coupling coefficient k. Hence, mutual inductance between inductors L1 and L3 and mutual inductance between inductors L2 and L4 may have the same mutual inductance value M ($M = k \cdot \sqrt{L_G \cdot L_D}$).

Since the LC tank circuit 102 is coupled to gate nodes of NMOS transistors MN1 and MN2 and energy is magnetically pumped into the LC tank circuit 102, the non-linear capacitor C of the LC tank circuit 102 is not directly connected to drain nodes of the NMOS transistors MN1 and MN2. Hence, the non-linear capacitor issue at the drain nodes of the NMOS transistors MN1 and MN2 can be mitigated. Specifically, the thermal noise introduced by NMOS transistors MN1 and MN2 is attenuated by the magnetic coupling (i.e., inductive coupling), such that only a fraction $$\left(\frac{M}{L_G}\right)$$

of the thermal noise enters the LC tank circuit 102. The undesired noise conversion at the LC tank circuit 102 is effectively mitigated.

It should be noted that the negative transconductance ($-g_m$) resulting from the cross-coupling configuration of the NMOS transistors MN1 and MN2 may also be reduced by the magnetic coupling (i.e., inductive coupling). To achieve better driving capability, the NMOS transistors MN1 and MN2 may be implemented by large-sized transistors. However, this is for illustrative purposes only, and is not meant to be a limitation of the present invention.

Since the LC tank circuit 102 is coupled to gate nodes of NMOS transistors MN1 and MN2 without being directly connected to drain nodes of NMOS transistors MN1 and MN2, a resonant frequency $F_{OSC}$ of the LC tank circuit 102 depends on the inductance value $L_G$ of the inductor L3/L4, and is independent of the inductance value $L_D$ of the inductor L1/L2 and the coupling coefficient k of magnetic coupling (i.e., inductive coupling). For example, the resonant frequency is expressed by $$F_{OSC} = \frac{1}{2\pi\sqrt{L_G C_G}},$$

where $C_G$ represents the capacitance value of the capacitor C, and $L_G$ represents the inductance value of the inductor L3/L4. Since the resonant frequency $F_{OSC}$ depends on the inductance value $L_G$, the quality factor Q of each inductor L3/L4 has the same requirement as the conventional VCO. Since the resonant frequency $F_{OSC}$ is independent of the inductance value $L_D$, the quality factor Q of each inductor L1/L2 can be much more relaxed without affecting the oscillation result.

Since the LC tank circuit 102 is coupled to gate nodes of NMOS transistors MN1 and MN2 without being directly connected to drain nodes of NMOS transistors MN1 and MN2, a voltage swing at the gate node and a voltage swing at the drain node can be separately designed. For example, a ratio of a voltage swing $V_{PP}\_Gate$ at the gate node of each NMOS transistor MN1/MN2 to a voltage swing $V_{PP}\_Drain$ at the drain node of each NMOS transistor MN1/MN2 is equal to a ratio of the inductance value $L_G$ of each inductor L3/L4 to the mutual inductance value M ($M=k \cdot \sqrt{L_G \cdot L_D}$). That is, $V_{PP}\_Gate:V_{PP}\_Drain=L_G:M$. A proper design of the parameters $L_G$ and M can ensure that there is a larger voltage swing at the LC tank circuit 102 (i.e., a large voltage swing at the gate node of each NMOS transistor MN1/MN2) and there is a smaller voltage swing at the drain node of each NMOS transistor MN1/MN2. In this way, the gate swing of the NMOS transistor MN1/MN2 is no longer limited by the rail voltages. For example, $V_{PP}\_Gate>2*VDD$. To put it simply, the gate swing of the NMOS transistor MN1/MN2 can be maximized. In addition, the drain swing of the NMOS transistor MN1/MN2 can be minimized to achieve lower noise conversion at the LC tank circuit 102.

If the NMOS transistor MN1/MN2 enters a triode region, the LC tank circuit 102 has additional loss and degrades the phase noise performance. As mentioned above, a proper design can achieve larger gate swing and smaller drain swing (e.g., $V_{PP}\_Gate>V_{PP}\_Drain$). Hence, the voltage swing at the gate node $V_{PP}\_Gate$ and the voltage swing at the drain node $V_{PP}\_Drain$ may be properly designed to prevent any of the NMOS transistors MN1 and MN2 from entering the triode region. Specifically, any of the NMOS transistors MN1 and MN2 is prevented from entering the triode region due to $V_{PP}\_Gate>V_{PP}\_Drain$.

Since the LC tank circuit 102 is coupled to gate nodes of NMOS transistors MN1 and MN2 without being directly connected to drain nodes of NMOS transistors MN1 and MN2, biasing at gate nodes is not determined by voltages at drain nodes. Hence, the biasing at gate nodes of the VCO 100 can be freely adjusted for a power-efficient operation. In other words, a low-power magnetically pumped VCO is realized by individually setting the bias voltage $V_{G\_BIAS\_N}$.

In the embodiment shown in FIG. 1, MOS transistors employed by the VCO 100 are NMOS transistors. However, this is for illustrative purposes only, and is not meant to be a limitation of the present invention. In one alternative design, P-channel metal oxide semiconductor (PMOS) transistors may be employed by a magnetically pumped VCO. In another alternative design, complementary metal oxide semiconductor (CMOS) transistors, each consisting of a PMOS transistor and an NMOS transistor, may be employed by a magnetically pumped VCO.

Figure 2:
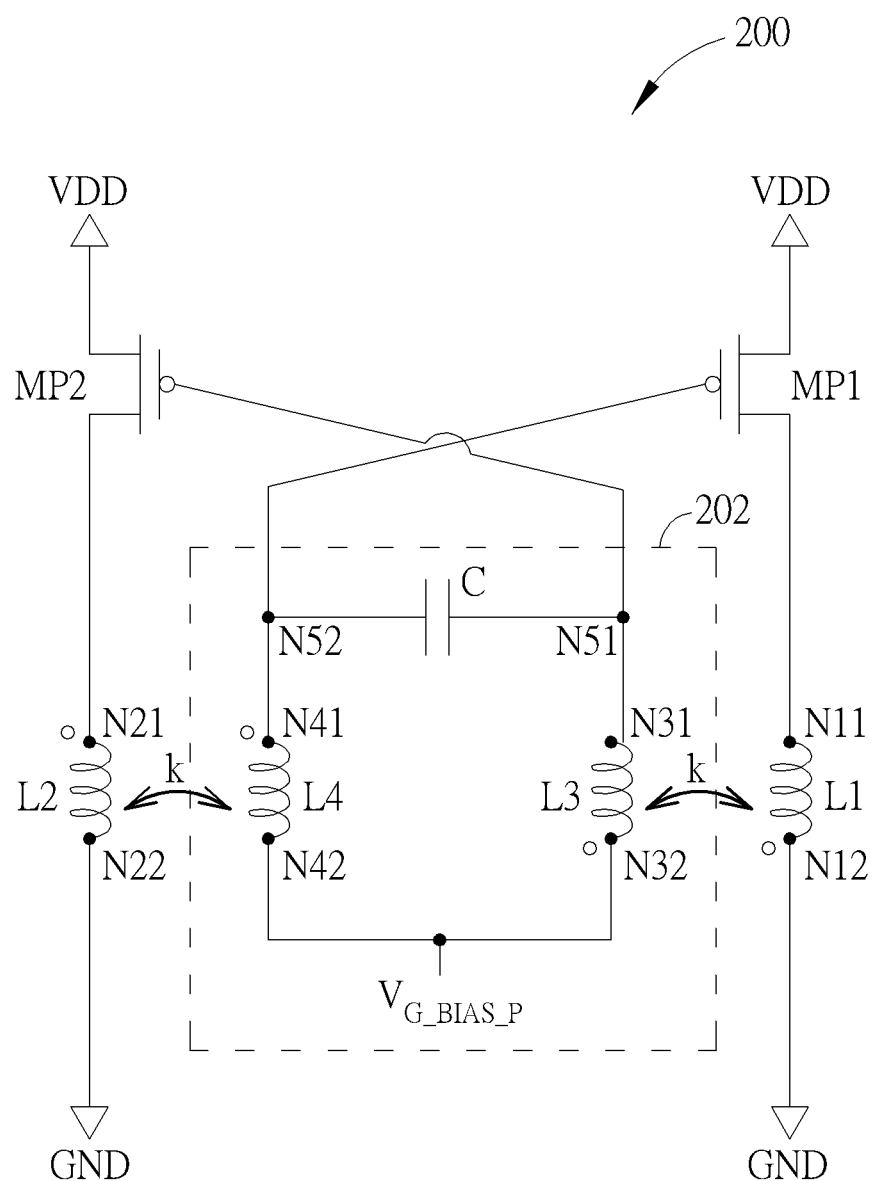
FIG. 2 is a circuit diagram illustrating a second magnetically pumped voltage controlled oscillator according to an embodiment of the present invention.

FIG. 2 is a circuit diagram illustrating a second magnetically pumped VCO according to an embodiment of the present invention. The VCO 200 includes a single LC tank circuit 202, a plurality of inductors L1 and L2, and a plurality of PMOS transistors MP1 and MP2. The LC tank circuit 202 includes a plurality of inductors L3 and L4 and a capacitor C. By way of example, but not limitation, the capacitor C may be implemented by a voltage-controlled capacitor that is used to adjust a resonant frequency of the LC tank circuit 202 in response to a control voltage of the VCO. One end N12 of the inductor L1 is coupled to a power rail GND, and the other end N11 of the inductor L1 is coupled to a drain node of the PMOS transistor MP1. One end N22 of the inductor L2 is coupled to the power rail GND, and the other end N21 of the inductor L2 is coupled to a drain node of the PMOS transistor MP2. A source node of the PMOS transistor MP1 and a source node of the PMOS transistor MP2 are both coupled to a power rail VDD. In this embodiment, the power rail VDD is used to deliver a supply voltage (e.g., 0.6V or 0.8V), and the power rail GND is used to deliver a ground voltage (e.g., 0V).

The LC tank circuit 202 is coupled to a gate node of the PMOS transistor MP1 and a gate node of the PMOS transistor MP2. In this embodiment, energy is magnetically pumped into the LC tank circuit 202 through the inductors L1 and L2, such that there is no direct connection between the LC tank circuit 202 and the drain node of the PMOS transistor MP1 and there is no direct connection between the LC tank circuit 202 and the drain node of the PMOS transistor MP2. As shown in FIG. 2, the LC tank circuit 202 and the PMOS transistors MP1 and MP2 are cross-coupled. Specifically, one end N51 of the capacitor C is coupled to a gate node of the PMOS transistor MP2, and the other end N52 of the capacitor C is coupled to a gate node of the PMOS transistor MP1, where differential oscillating signals are generated at two ends of the capacitor C. In this embodiment, the LC tank circuit 202 is directly connected to gate nodes of the PMOS transistor MP1 and MP2 without via any magnetic coupling (i.e., inductive coupling). Hence, the pumping force is not weakened significantly due to the fact the LC tank circuit 202 is not totally separated from drain nodes and gate nodes of PMOS transistors MP1 and MP2. In addition, the inductor L3 is magnetically coupled to the inductor L1, where one end N32 of the inductor L3 is coupled to a bias voltage $V_{G\_BIAS\_P}$ that may be generated from a bias voltage generator (not shown), and the other end N31 of the inductor L3 is coupled to one end N51 of the capacitor C; and the inductor L4 is magnetically coupled to the inductor L2, where one end N42 of the inductor L4 is coupled to the bias voltage $V_{G\_BIAS\_P}$, and the other end N41 of the inductor L4 is coupled to the other end N52 of the capacitor C.

For example, the inductors L1 and L2 may have the same inductance value $L_D$, the inductors L3 and L4 may have the same inductance value $L_G$, and magnetic coupling (i.e., inductive coupling) between inductors L1 and L3 and magnetic coupling (i.e., inductive coupling) between inductors L2 and L4 may have the same coupling coefficient k. Hence, mutual inductance between inductors L1 and L3 and mutual inductance between inductors L2 and L4 may have the same mutual inductance value M ($M=k \cdot \sqrt{L_7 \cdot L_D}$).

Since the LC tank circuit 202 is coupled to gate nodes of PMOS transistors MP1 and MP2 and energy is magnetically pumped into the LC tank circuit 202, the non-linear capacitor C of the LC tank circuit 202 is not directly connected to drain nodes of the PMOS transistors MP1 and MP2. Hence, the non-linear capacitor issue at the drain nodes of the PMOS transistors MP1 and MP2 can be mitigated. Specifically, the thermal noise introduced by PMOS transistors MP1 and MP2 is attenuated by the magnetic coupling (i.e., inductive coupling), such that only a fraction $$\left(\frac{M}{L_G}\right)$$

of the thermal noise enters the LC tank circuit 202. The undesired noise conversion at the LC tank circuit 202 is effectively mitigated.

It should be noted that the negative transconductance ($-g_m$) resulting from the cross-coupling configuration of the PMOS transistors MP1 and MP2 may also be reduced by the magnetic coupling (i.e., inductive coupling). To achieve better driving capability, the PMOS transistors MP1 and MP2 may be implemented by large-sized transistors. However, this is for illustrative purposes only, and is not meant to be a limitation of the present invention.

Since the LC tank circuit 202 is coupled to gate nodes of PMOS transistors MP1 and MP2 without being directly connected to drain nodes of PMOS transistors MP1 and MP2, a resonant frequency $F_{OSC}$ of the LC tank circuit 202 depends on the inductance value $L_G$ of the inductor L3/L4, and is independent of the inductance value $L_D$ of the inductor L1/L2 and the coupling coefficient k of magnetic coupling (i.e., inductive coupling). For example, the resonant frequency is expressed by $$F_{OSC} = \frac{1}{2\pi\sqrt{L_G C_G}},$$

where $C_G$ represents the capacitance value of the capacitor C, and $L_G$ represents the inductance value of the inductor L3/L4. Since the resonant frequency $F_{OSC}$ depends on the inductance value $L_G$, the quality factor Q of each inductor L3/L4 has the same requirement as the conventional VCO. Since the resonant frequency $F_{OSC}$ is independent of the inductance value $L_D$, the quality factor Q of each inductor L1/L2 can be much more relaxed without affecting the oscillation result.

Since the LC tank circuit 202 is coupled to gate nodes of PMOS transistors MP1 and MP2 without being directly connected to drain nodes of PMOS transistors MP1 and MP2, a voltage swing at the gate node and a voltage swing at the drain node can be separately designed. For example, a ratio of a voltage swing $V_{PP\_Gate}$ at the gate node of each PMOS transistor MP1/MP2 to a voltage swing $V_{PP\_Drain}$ at the drain node of each PMOS transistor MP1/MP2 is equal to a ratio of the inductance value $L_G$ of each inductor L3/L4 to the mutual inductance value M ($M=k\cdot\sqrt{L_G \cdot L_D}$). That is, $V_{PP\_Gate}:V_{PP\_Drain}=L_G:M$. A proper design of the parameters $L_G$ and M can ensure that there is a larger voltage swing at the LC tank circuit 202 (i.e., a large voltage swing at the gate node of each PMOS transistor MP1/MP2) and there is a smaller voltage swing at the drain node of each PMOS transistor MP1/MP2. In this way, the gate swing of the PMOS transistor MP1/MP2 is no longer limited by the rail voltages. For example, $V_{PP\_Gate}>2*VDD$. To put it simply, the gate swing of the PMOS transistor MP1/MP2 can be maximized. In addition, the drain swing of the PMOS transistor MP1/MP2 can be minimized to achieve lower noise conversion at the LC tank circuit 202.

If the PMOS transistor MP1/MP2 enters a triode region, the LC tank circuit 202 has additional loss and degrades the phase noise performance. As mentioned above, a proper design can achieve larger gate swing and smaller drain swing (e.g., $V_{PP\_Gate}>V_{PP\_Drain}$). Hence, the voltage swing at the gate node $V_{PP\_Gate}$ and the voltage swing at the drain node $V_{PP\_Drain}$ are properly designed to prevent any of the PMOS transistors MP1 and MP2 from entering the triode region. Specifically, any of the PMOS transistors MP1 and MP2 is prevented from entering the triode region due to $V_{PP\_Gate}>V_{PP\_Drain}$.

Since the LC tank circuit 202 is coupled to gate nodes of PMOS transistors MP1 and MP2 without being directly connected to drain nodes of PMOS transistors MP1 and MP2, biasing at gate nodes is not determined by voltages of drain nodes. Hence, the biasing at gate nodes of the VCO 200 can be freely adjusted for a power-efficient operation. In other words, a low-power magnetically pumped VCO is realized by individually setting the bias voltage $V_{G\_BIAS\_P}$.

Figure 3:
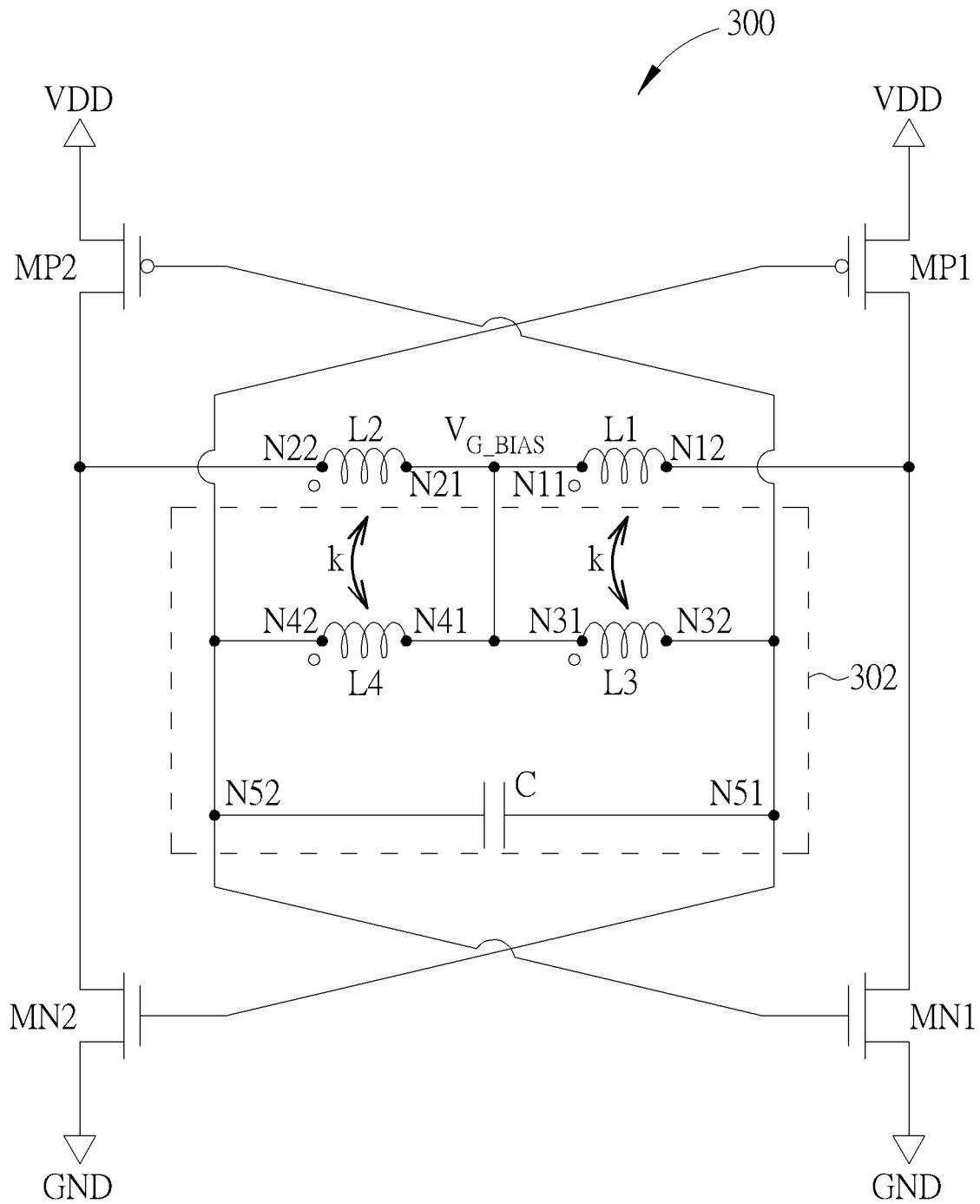
FIG. 3 is a circuit diagram illustrating a third magnetically pumped voltage controlled oscillator according to an embodiment of the present invention.

FIG. 3 is a circuit diagram illustrating a third magnetically pumped VCO according to an embodiment of the present invention. The VCO 300 includes a single LC tank circuit 302, a plurality of inductors L1 and L2, a plurality of NMOS transistors MN1 and MN2, and a plurality of PMOS transistors MP1 and MP2. The LC tank circuit 302 includes a plurality of inductors L3 and L4 and a capacitor C. By way of example, but not limitation, the capacitor C may be implemented by a voltage-controlled capacitor that is used to adjust a resonant frequency of the LC tank circuit 302 in response to a control voltage of the VCO. A drain end of the PMOS transistor MP1 and a drain end of the NMOS transistor MN1 are both coupled to one end N12 of the inductor L1. A drain end of the PMOS transistor MP2 and a drain end of the NMOS transistor MN2 are both coupled to one end N22 of the inductor L2. A source end of the PMOS transistor MP1 and a source end of the PMOS transistor MP2 are both coupled to a power rail VDD. A source end of the NMOS transistor MN1 and a source end of the NMOS transistor MN2 are both coupled to a power rail GND. The other end N11 of the inductor L1 is coupled to the other end N21 of the inductor L2, where a bias voltage $V_{G\_BIAS}$ applied to ends N11 and N21 of inductors L1 and L2 may be generated from a bias voltage generator (not shown). In this embodiment, the power rail VDD is used to deliver a supply voltage (e.g., 0.6V or 0.8V), and the power rail GND is used to deliver a ground voltage (e.g., 0V).

The LC tank circuit 302 is coupled to a gate node of the PMOS transistor MP1, a gate node of the PMOS transistor MP2, a gate node of the NMOS transistor MN1, and a gate node of the NMOS transistor MN2. In this embodiment, energy is magnetically pumped into the LC tank circuit 302 through the inductors L1 and L2, such that there is no direct connection between the LC tank circuit 302 and the drain node of each of the PMOS transistors MP1 and MP2, and there is no direct connection between the LC tank circuit 302 and the drain node of each of the NMOS transistor MN1 and MN2. As shown in FIG. 3, the LC tank circuit 302 and the PMOS transistors MP1 and MP2 are cross-coupled, and the LC tank circuit 302 and the NMOS transistors MN1 and MN2 are cross-coupled. Specifically, one end N51 of the capacitor C is coupled to a gate node of the PMOS transistor MP2 and a gate node of the NMOS transistor MN2, and the other end N52 of the capacitor C is coupled to a gate node of the PMOS transistor MP1 and a gate node of the NMOS transistor MN1, where differential oscillating signals are generated at two ends of the capacitor C. The inductor L3 is magnetically coupled to the inductor L1, where one end N31 of the inductor L3 is coupled to the bias voltage $V_{G\_BIAS}$, and the other end N32 of the inductor L3 is coupled to one end N51 of the capacitor C; and the inductor L4 is magnetically coupled to the inductor L2, where one end N41 of the inductor L4 is coupled to the bias voltage $V_{G\_BIAS}$, and the other end N42 of the inductor L4 is coupled to the other end N52 of the capacitor C.

For example, the inductors L1 and L2 may have the same inductance value $L_D$, the inductors L3 and L4 may have the same inductance value $L_G$, and magnetic coupling (i.e., inductive coupling) between inductors L1 and L3 and magnetic coupling (i.e., inductive coupling) between inductors L2 and L4 may have the same coupling coefficient k. Hence, mutual inductance between inductors L1 and L3 and mutual inductance between inductors L2 and L4 may have the same mutual inductance value M ($M=k\cdot\sqrt{L_G\cdot L_D}$).

The CMOS-type VCO 300 shown in FIG. 3 is based on the NMOS-type VCO 100 shown in FIG. 1 and the PMOS-type VCO 200 shown in FIG. 2, and thus has the same benefits possessed by the VCOs 100 and 200 as mentioned above. As a person skilled in the art can readily understand details of the VCO 300 after reading above paragraphs directed to the VCOs 100 and 200, further description is omitted here for brevity.

In the embodiment shown in FIG. 3, the same bias voltage $V_{G\_BIAS}$ is applied to node N11 of the inductor L1, node N21 of the inductor L2, node N31 of the inductor L3, and node N41 of the inductor L4. However, this is for illustrative purposes only, and is not meant to be a limitation of the present invention. Alternatively, different bias voltages may be employed by a CMOS-type magnetically pumped VCO.

Figure 4:
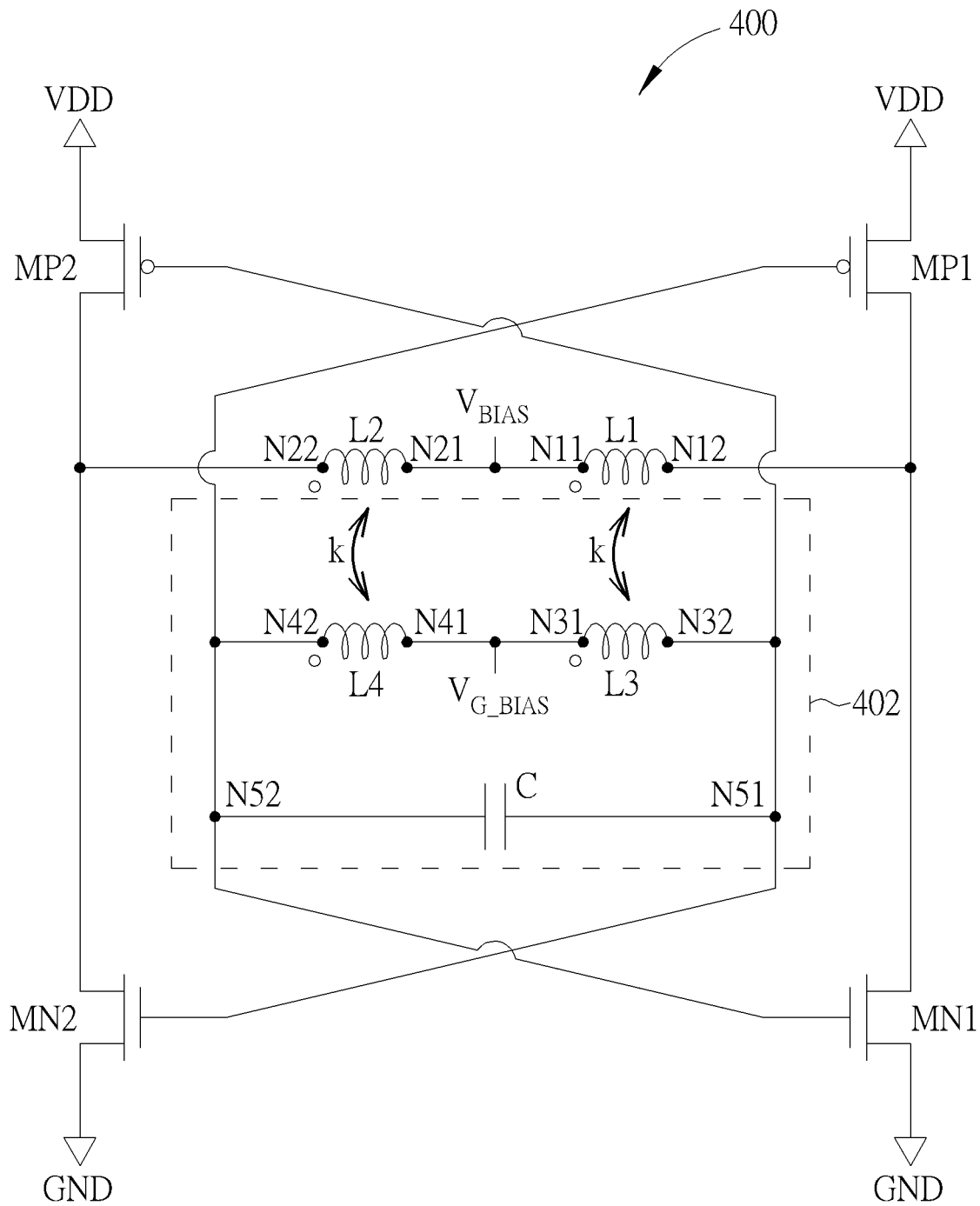
FIG. 4 is a circuit diagram illustrating a fourth magnetically pumped voltage controlled oscillator according to an embodiment of the present invention.

FIG. 4 is a circuit diagram illustrating a fourth magnetically pumped VCO according to an embodiment of the present invention. The VCO 400 includes a single LC tank circuit 402, a plurality of inductors L1 and L2, a plurality of NMOS transistors MN1 and MN2, and a plurality of PMOS transistors MP1 and MP2. The major difference between VCOs 300 and 400 is that one bias voltage $V_{BIAS}$ is applied to node N11 of the inductor L1 and node N21 of the inductor L2, and another bias voltage $V_{G\_BIAS}$ is applied to node N31 of the inductor L3 and node N41 of the inductor L4, where the bias voltages $V_{BIAS}$ and $V_{G\_BIAS}$ may be generated from one or more bias voltage generators (not shown). The bias voltages $V_{BIAS}$ and $V_{G\_BIAS}$ are not necessarily the same. In other words, the bias voltages $V_{BIAS}$ and $V_{G\_BIAS}$ used by the VCO 400 can be separately determined, such that a setting of the bias voltage $V_{BIAS}$ is independent of a setting of the bias voltage $V_{G\_BIAS}$.

In the embodiments shown in FIG. 3 and FIG. 4, a single set of inductors L1 and L2 is at drain nodes of four MOS transistors, including PMOS transistors MP1 and MP2 and NMOS transistors MN1 and MN2. However, this is for illustrative purposes only, and is not meant to be a limitation of the present invention. Alternatively, one set of inductors may be at drain nodes of PMOS transistors, and another set of inductors may be at drain nodes of NMOS transistors.

Figure 5:
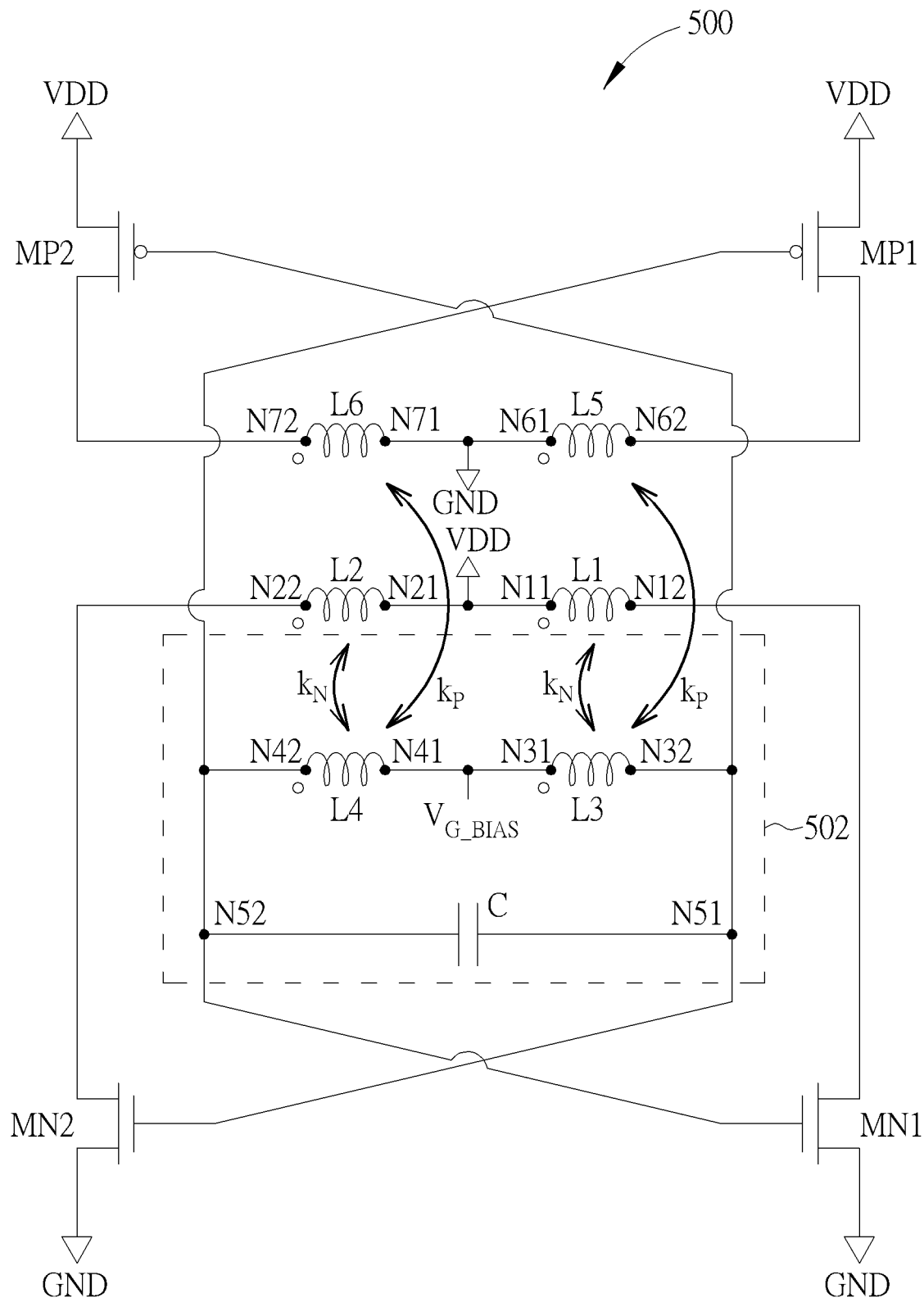
FIG. 5 is a circuit diagram illustrating a fifth magnetically pumped voltage controlled oscillator according to an embodiment of the present invention.

FIG. 5 is a circuit diagram illustrating a fifth magnetically pumped VCO according to an embodiment of the present invention. The VCO 500 includes a single LC tank circuit 502, a plurality of inductors L1, L2, L5, and L6, a plurality of NMOS transistors MN1 and MN2, and a plurality of PMOS transistors MP1 and MP2. The LC tank circuit 502 includes a plurality of inductors L3 and L4 and a capacitor C. By way of example, but not limitation, the capacitor C may be implemented by a voltage-controlled capacitor that is used to adjust a resonant frequency of the LC tank circuit 502 in response to a control voltage of the VCO. A drain end of the PMOS transistor MP1 is coupled to one end N62 of the inductor L5, and a source end of the PMOS transistor MP1 is coupled to a power rail VDD. A drain end of the PMOS transistor MP2 is coupled to one end N72 of the inductor L6, and a source end of the PMOS transistor MP2 is coupled to the power rail VDD. A drain end of the NMOS transistor MN1 is coupled to one end N12 of the inductor L1, and a source end of the NMOS transistor MN1 is coupled to a power rail GND. A drain end of the NMOS transistor MN2 is coupled to one end N22 of the inductor L2, and a source end of the NMOS transistor MN2 is coupled to the power rail GND. The other end N61 of the inductor L5 and the other end N71 of the inductor L6 are both coupled to the power rail GND. The other end N11 of the inductor L1 and the other end N21 of the inductor L2 are both coupled to the power rail VDD. In this embodiment, the power rail VDD is used to deliver a supply voltage (e.g., 0.6V or 0.8V), and the power rail GND is used to deliver a ground voltage (e.g., 0V).

The LC tank circuit 502 is coupled to a gate node of the PMOS transistor MP1, a gate node of the PMOS transistor MP2, a gate node of the NMOS transistor MN1, and a gate node of the NMOS transistor MN2. In this embodiment, energy is magnetically pumped into the LC tank circuit 502 through the inductors L1, L2, L5, and L6, such that there is no direct connection between the LC tank circuit 502 and the drain node of each of the PMOS transistors MP1 and MP2, and there is no direct connection between the LC tank circuit 502 and the drain node of each of the NMOS transistors MN1 and MN2. As shown in FIG. 5, the LC tank circuit 502 and the PMOS transistors MP1 and MP2 are cross-coupled, and the LC tank circuit 502 and the NMOS transistors MN1 and MN2 are cross-coupled. Specifically, one end N51 of the capacitor C is coupled to a gate node of the PMOS transistor MP2 and a gate node of the NMOS transistor MN2, and the other end N52 of the capacitor C is coupled to a gate node of the PMOS transistor MP1 and a gate node of the NMOS transistor MN1, where differential oscillating signals are generated at two ends of the capacitor C. The inductor L3 is magnetically coupled to both of the inductors L1 and L5, where one end N31 of the inductor L3 is coupled to a bias voltage $V_{G\_BIAS}$ that may be generated from a bias voltage generator (not shown), the other end N32 of the inductor L3 is coupled to one end N51 of the capacitor C; and the inductor L4 is magnetically coupled to both of the inductors L2 and L6, where one end N41 of the inductor L4 is coupled to the bias voltage $V_{G\_BIAS}$, and the other end N42 of the inductor L4 is coupled to the other end N52 of the capacitor C.

For example, the inductors L1, L2, L5, and L6 may have the same inductance value $L_D$, the inductors L3 and L4 may have the same inductance value $L_G$, magnetic coupling (i.e., inductive coupling) between inductors L1 and L3 and magnetic coupling (i.e., inductive coupling) between inductors L2 and L4 may have the same coupling coefficient $k_N$, and magnetic coupling (i.e., inductive coupling) between inductors L3 and L5 and magnetic coupling (i.e., inductive coupling) between inductors L4 and L6 may have the same coupling coefficient $k_P$. Hence, mutual inductance between inductors L3 and L5 and mutual inductance between inductors L4 and L6 may have the same mutual inductance value $M_P$ ($M_P=k_P\cdot\sqrt{L_G\cdot L_D}$), and mutual inductance between inductors L1 and L3 and mutual inductance between inductors L2 and L4 may have the same mutual inductance value $M_N$ ($M_N=k_N\cdot\sqrt{L_G\cdot L_D}$).

The CMOS-type VCO 500 shown in FIG. 5 is based on the NMOS-type VCO 100 shown in FIG. 1 and the PMOS-type VCO 200 shown in FIG. 2, and thus has the same benefits possessed by the VCOs 100 and 200 as mentioned above. As a person skilled in the art can readily understand details of the VCO 500 after reading above paragraphs directed to the VCOs 100 and 200, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage controlled oscillator comprising:
a first inductor, having a first end and a second end;
a second inductor, having a first end and a second end, wherein the first end of the second inductor is coupled to the first end of the first inductor;
a first P-channel metal oxide semiconductor (PMOS) transistor, having a gate node, a drain node, and a source node, wherein the drain node of the first PMOS transistor is coupled to the second end of the first inductor, and the source node of the first MOS transistor is coupled to a first power rail;
a second PMOS transistor, having a gate node, a drain node, and a source node, wherein the drain node of the second PMOS transistor is coupled to the second end of the second inductor, and the source node of the second PMOS transistor is coupled to the first power rail;
a first N-channel metal oxide semiconductor (NMOS) transistor, having a gate node, a drain node, and a source node, wherein the drain node of the first NMOS transistor is coupled to the second end of the first inductor, and the source node of the first MOS transistor is coupled to a second power rail;
a second NMOS transistor, having a gate node, a drain node, and a source node, wherein the drain node of the second NMOS transistor is coupled to the second end of the second inductor, and the source node of the second NMOS transistor is coupled to the second power rail; and
an inductor-capacitor (LC) tank circuit, coupled to the gate node of the first PMOS transistor, the gate node of the second PMOS transistor, the gate node of the first NMOS transistor, and the gate node of the second NMOS transistor, wherein energy is magnetically pumped into the LC tank circuit through the first inductor and the second inductor, such that there is no direct connection between the LC tank circuit and the drain node of each of the first PMOS transistor and the first NMOS transistor and there is no direct connection between the LC tank circuit and the drain node of each of the second PMOS transistor and the second NMOS transistor.

2. The voltage controlled oscillator of claim 1, wherein the LC tank circuit comprises:
a capacitor, wherein a first end of the capacitor is coupled to the gate node of the second PMOS transistor and the gate node of the second NMOS transistor, and a second end of the capacitor is coupled to the gate node of the first PMOS transistor and the gate node of the first NMOS transistor;
a third inductor, magnetically coupled to the first inductor, wherein a first end of the third inductor is coupled to a first bias voltage, and a second end of the third inductor is coupled to the first end of the capacitor; and
a fourth inductor, magnetically coupled to the second inductor, wherein a first end of the fourth inductor is coupled to the first bias voltage, and a second end of the fourth inductor is coupled to the second end of the capacitor.

3. The voltage controlled oscillator of claim 2, wherein the first end of the first inductor and the first end of the second inductor are coupled to the first bias voltage.

4. The voltage controlled oscillator of claim 2, wherein the first end of the first inductor and the first end of the second inductor are coupled to a second bias voltage, and a setting of the first bias voltage is independent of a setting of the second bias voltage.

5. A voltage controlled oscillator comprising:
a first inductor, having a first end and a second end;
a second inductor, having a first end and a second end, wherein the first end of the second inductor is coupled to the first end of the first inductor;
a third inductor, having a first end and a second end;
a fourth inductor, having a first end and a second end, wherein the first end of the fourth inductor is coupled to the first end of the third inductor;
a first P-channel metal oxide semiconductor (PMOS) transistor, having a gate node, a drain node, and a source node, wherein the drain node of the first PMOS transistor is coupled to the second end of the first inductor, and the source node of the first MOS transistor is coupled to a first power rail;
a second PMOS transistor, having a gate node, a drain node, and a source node, wherein the drain node of the second PMOS transistor is coupled to the second end of the second inductor, and the source node of the second PMOS transistor is coupled to the first power rail;
a first N-channel metal oxide semiconductor (NMOS) transistor, having a gate node, a drain node, and a source node, wherein the drain node of the first NMOS transistor is coupled to the second end of the third inductor, and the source node of the first MOS transistor is coupled to a second power rail;
a second NMOS transistor, having a gate node, a drain node, and a source node, wherein the drain node of the second NMOS transistor is coupled to the second end of the fourth inductor, and the source node of the second NMOS transistor is coupled to the second power rail; and
an inductor-capacitor (LC) tank circuit, coupled to the gate node of the first PMOS transistor, the gate node of the second PMOS transistor, the gate node of the first NMOS transistor, and the gate node of the second NMOS transistor, wherein energy is magnetically pumped into the LC tank circuit through the first inductor, the second inductor, the third inductor, and the fourth inductor, such that there is no direct connection between the LC tank circuit and the drain node of each of the first PMOS transistor and the first NMOS transistor and there is no direct connection between the LC tank circuit and the drain node of each of the second PMOS transistor and the second NMOS transistor.

6. The voltage controlled oscillator of claim 5, wherein the LC tank circuit comprises:
a capacitor, wherein a first end of the capacitor is coupled to the gate node of the second PMOS transistor and the gate node of the second NMOS transistor, and a second end of the capacitor is coupled to the gate node of the first PMOS transistor and the gate node of the first NMOS transistor;
a third inductor, magnetically coupled to both of the first inductor and the third inductor, wherein a first end of the third inductor is coupled to a bias voltage, and a second end of the third inductor is coupled to the first end of the capacitor; and a fourth inductor, magnetically coupled to both of the second inductor and the fourth inductor, wherein a first end of the fourth inductor is coupled to the bias voltage, and a second end of the fourth inductor is coupled to the second end of the capacitor.

7. The voltage controlled oscillator of claim 5, wherein the first end of the first inductor and the first end of the second inductor are coupled to the second power rail.

8. The voltage controlled oscillator of claim 5, wherein the first end of the third inductor and the first end of the fourth inductor are coupled to the first power rail.

* * * * *